(12) United States Patent
Takahashi (10) Patent No.: US 9,478,647 B2
(45) Date of Patent: Oct. 25, 2016

(54) SEMICONDUCTOR DEVICE (71) Applicant: Mitsubishi Electric Corporation, Tokyo (JP)

(72) Inventor: Tetsuo Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/848,314

(22) Filed: Sep. 8, 2015

(65) Prior Publication Data

US 2016/0141400 A1    May 19, 2016

(30) Foreign Application Priority Data

Nov. 13, 2014   (JP) ................. 2014-230928

(51) Int. Cl.
*H01L 29/73*    (2006.01)
*H01L 29/739*    (2006.01)
*H01L 27/06*    (2006.01)

(52) U.S. Cl.
CPC ....... *H01L 29/7397* (2013.01); *H01L 27/0623* (2013.01); *H01L 29/7391* (2013.01)

(58) Field of Classification Search
CPC ........... H01L 29/7397; H01L 27/0623; H01L 29/7391
See application file for complete search history.

(56) References Cited

U.S. PATENT DOCUMENTS

| | | |
|---|---|---|
| 4,689,647 A | 8/1987 | Nakagawa et al. |
| 2005/0045960 A1 | 3/2005 | Takahashi |
| 2005/0258493 A1 | 11/2005 | Aono et al. |
| 2007/0108468 A1 | 5/2007 | Takahashi |
| 2008/0048295 A1 | 2/2008 | Takahashi |
| 2008/0093697 A1 | 4/2008 | Kaneda et al. |
| 2008/0102576 A1 | 5/2008 | Suzuki et al. |
| 2010/0156506 A1 | 6/2010 | Tsuzuki et al. |
| 2012/0043581 A1* | 2/2012 | Koyama ............. H01L 29/0696 257/140 |
| 2012/0181575 A1 | 7/2012 | Pfirsch |
| 2014/0361333 A1 | 12/2014 | Kimura et al. |

FOREIGN PATENT DOCUMENTS

| | | |
|---|---|---|
| JP | S61-015370 A | 1/1986 |
| JP | H11-097715 A | 4/1999 |
| JP | 2004-363328 A | 12/2004 |
| JP | 2005-101514 A | 4/2005 |
| JP | 2005-275688 A | 10/2005 |
| JP | 2005-317751 A | 11/2005 |

(Continued)

OTHER PUBLICATIONS

Hideki Takahashi et al., "1200 V Reverse Conducting IGBT", Proceeding of 2004 International symposium on Power Semiconductor Devices & ICs, pp. 133-136, Kitakyusyu, Japan.

(Continued)

*Primary Examiner* — Roy Potter
*Assistant Examiner* — Paul Patton
(74) *Attorney, Agent, or Firm* — Studebaker & Brackett PC (57) ABSTRACT

A semiconductor device is configured such that the distance between the trench gate in the IGBT and the trench gate in the diode is reduced or a p-well layer is provided between the trench gate in the IGBT and the trench gate in the diode.

10 Claims, 8 Drawing Sheets

(56) References Cited

FOREIGN PATENT DOCUMENTS

| JP | 2007-048769 A | 2/2007 |
| JP | 2007-134625 A | 5/2007 |
| JP | 2008-053648 A | 3/2008 |
| JP | 2008-103590 A | 5/2008 |
| JP | 2008-109028 A | 5/2008 |
| JP | 2009-170670 A | 7/2009 |
| JP | 2010-171385 A | 8/2010 |
| JP | 2012-114321 A | 6/2012 |
| JP | 2012-151470 A | 8/2012 |
| JP | 2013-152996 A | 8/2013 |

OTHER PUBLICATIONS

Dinesh Kumar et al., "RC-TCIGBT: A Reverse Conducting Trench Clustered IGBT", Proceeding of 19th International Symposium on Power Semiconductor Devices & ICs, pp. 161-164, May 27-30, 2007, Jeju, Korea.

M. Rahimo et al., The Bi-mode Insulated Gate Transistor (BIGT) a Potential Technology for Higher Power Applications; proceeding of the 21st International symposium on Power Semiconductor Devices & ICs, pp. 283-286, 2009.

* cited by examiner

SEMICONDUCTOR DEVICE

BACKGROUND OF THE INVENTION

1. Field of the Invention

The present invention relates to a semiconductor device used for control of a large current for example.

2. Background Art

Japanese Patent Laid-Open No. 2013-152996 discloses a semiconductor device having an IGBT and a diode formed on a substrate. This semiconductor device is generally called a reverse conducting insulated gate bipolar transistor (RC-IGBT).

In some cases, a trench gate is formed in each of an IGBT and a diode in an RC-IGBT. The trench gate in the diode is provided for the purpose of increasing the withstand voltage with respect to the Vce voltage (emitter-collector voltage). The gate capacitance can be reduced by electrically insulating the trench gate in the diode from the trench gate in the IGBT. There is a problem that in such a structure the depletion layer cannot extend smoothly in the substrate depth direction between the trench gate in the IGBT and the trench gate in the diode and a sufficiently high withstand voltage cannot be secured.

SUMMARY OF THE INVENTION

In view of the above-described problem, an object of the present invention is to provide a semiconductor device capable of securing a sufficiently high withstand voltage while reducing the gate capacitance.

The features and advantages of the present invention may be summarized as follows.

According to one aspect of the present invention, a semiconductor device includes an IGBT having a first trench gate and an emitter layer formed at a front surface side of a substrate and having a collector layer formed at a rear surface side of the substrate, and a diode having a second trench gate and an anode layer formed at the front surface side of the substrate and having a cathode layer formed at the rear surface side of the substrate, wherein the second trench gate is insulated from the first trench gate, the first trench gate has a plurality of first stripe portions and a first annular portion surrounding the diode as viewed in plan, the second trench gate has a plurality of second stripe portions and a second annular portion opposed to the first annular portion and surrounding the plurality of second stripe portions as viewed in plan, the distance between the first annular portion and the second annular portion is constant, and the distance between the first annular portion and the second annular portion is equal to or smaller than the larger one of the inter-stripe distance between the plurality of first stripe portions and the inter-stripe distance between the plurality of second stripe portions.

According to another aspect of the present invention, a semiconductor device includes an IGBT having a first trench gate and an emitter layer formed at a front surface side of a substrate and having a collector layer formed at a rear surface side of the substrate, and a diode having a second trench gate and an anode layer formed at the front surface side of the substrate and having a cathode layer formed at the rear surface side of the substrate, wherein the second trench gate is insulated from the first trench gate, the first trench gate has a plurality of first stripe portions, the second trench gate has a plurality of second stripe portions, the second trench gate is disposed in a direction of extension of the first trench gate, with gaps provided between the second trench gate and the first trench gate, and the gaps are staggered as viewed in plan.

According to another aspect of the present invention, a semiconductor device includes an IGBT having a first trench gate and an emitter layer formed at a front surface side of a substrate having an n-type drift layer, the IGBT also having a collector layer formed at a rear surface side of the substrate, and a diode having a second trench gate and an anode layer formed at the front surface side of the substrate and having a cathode layer formed at the rear surface side of the substrate, the second trench gate being insulated from the first trench gate by being spaced apart from the first trench gate, and a p-well layer covering an end portion of the second trench gate, covering a region between end portions of the first trench gate and the second trench gate, formed deeper than the first trench gate and the second trench gate and bounded on the drift layer.

Other and further objects, features and advantages of the invention will appear more fully from the following description.

DETAILED DESCRIPTION OF THE PREFERRED EMBODIMENTS

A semiconductor device according to an embodiment of the present invention will be described with reference to the drawings. Components identical or corresponding to each other are assigned the same reference characters and repeated description for them is omitted in some cases.

First Embodiment

Figure 1:
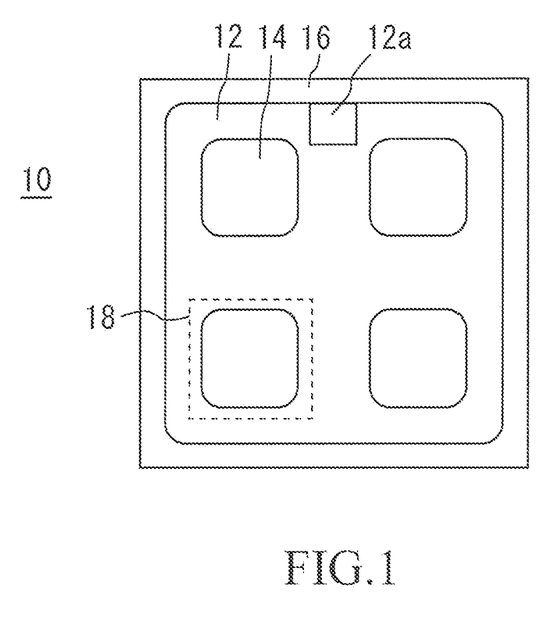
FIG. 1 is a plan view of a semiconductor device according to a first embodiment.

FIG. 1 is a plan view of a semiconductor device 10 according to a first embodiment of the present invention. The semiconductor device 10 is constituted by an RC-IGBT having an IGBT 12 and diodes 14. Four diodes 14 are formed in island form. The IGBT 12 is formed so as to surround the diodes 14. A gate pad 12a is provided as a portion of the IGBT 12. An n+-type emitter layer 16 is provided at the outermost peripheral end of the semiconductor device 10.

Figure 2:
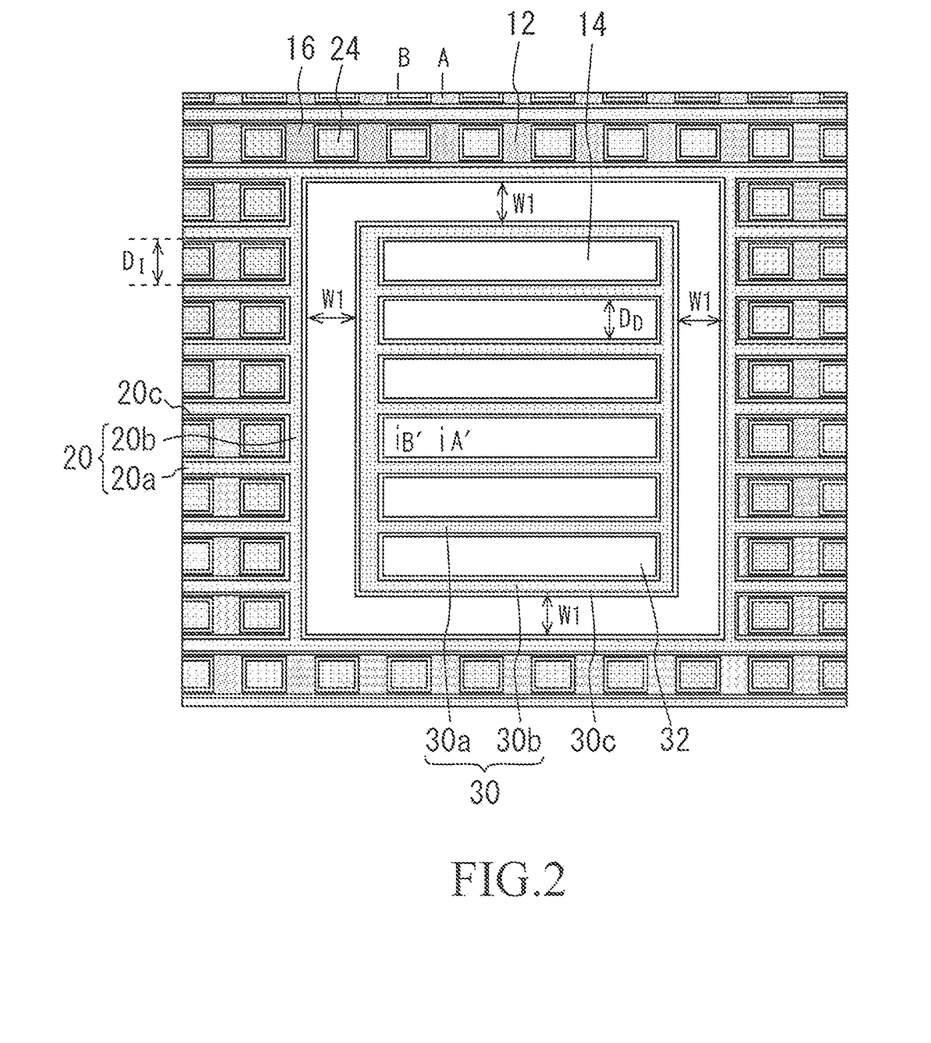
FIG. 2 shows a first trench gate and a second trench gate.

FIG. 2 is an enlarged diagram of a portion 18 indicated by a broken line in FIG. 1. The IGBT 12 has a first trench gate 20. The first trench gate 20 has a plurality of first stripe portions 20a and a first annular portion 20b surrounding the diodes 14 as viewed in plan. The plurality of first stripe portions 20a are provided in parallel with each other. Ends of the first stripe portions 20a are bounded on the first annular portion 20b. The stripe interval (distance) between each adjacent pair of the first stripe portions 20a is $D_I$. The first trench gate 20 is bounded on a gate oxide film 20c. In regions of the IGBT 12 surrounded by the first trench gate 20, an n+-type emitter layer 16 and a p+-type diffusion layer 24 are formed.

The diode 14 has a second trench gate 30. The second trench gate 30 has a plurality of second stripe portions 30a and a second annular portion 30b. The plurality of second stripe portions 30a are provided in parallel with each other. The stripe interval (distance) between each adjacent pair of the second stripe portions 30a is $D_D$. This distance $D_D$ and the above-mentioned distance $D_I$ are equal to each other. The second annular portion 30b is opposed to the first annular portion 20b as viewed in plan and surrounds the plurality of second stripe portions 30a. The second annular portion 30b is bounded on ends of the second stripe portions 30a. The second trench gate 30 is bounded on a gate oxide film 30c. A p-type anode layer 32 is formed in portions of the diodes 14 where the second trench gate 30 is not formed.

As is apparent from FIG. 2, the second trench gate 30 is insulated from the first trench gate 20. Also, the distance between the first annular portion 20b and the second annular portion 30b is constant. That is, the distance W1 between the first annular portion 20b and the second annular portion 30b is constant at any position, as indicated by W1 at four positions in FIG. 2. The distance W1 between the first annular portion 20b and the second annular portion 30b is equal to or smaller than the larger one of the inter-stripe distance $D_I$ between the plurality of first stripe portions 20a and the inter-stripe distance $D_D$ between the plurality of second stripe portions 30a.

Figure 3:
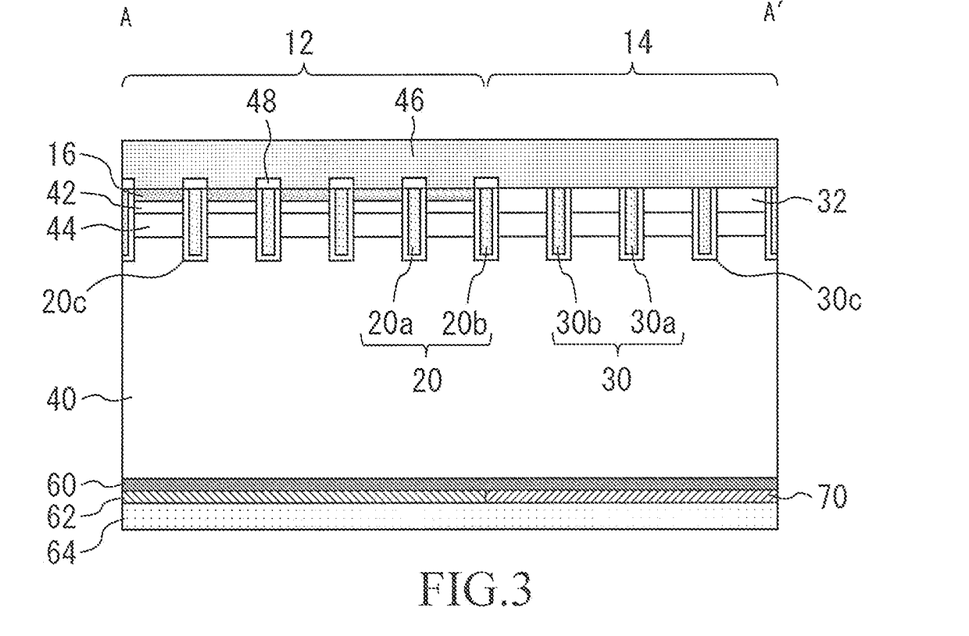
FIG. 3 is a sectional view taken along line A-A' in FIG. 2.

FIG. 3 is a sectional view taken along line A-A' in FIG. 2. The IGBT 12 and the diodes 14 are formed on a substrate 40. The substrate 40 is an n−-type drift layer. The IGBT 12 will first be described. The first trench gate 20 and the emitter layer 16 are formed at a front surface side of the substrate 40. A p-type base layer 42 is formed under the emitter layer 16. An n-type carrier storage layer 44 is formed under the base layer 42. An emitter electrode 46 bounded on the emitter layer 16 is provided on the emitter layer 16. Illustration of the emitter electrode 46 is omitted in FIG. 2. An interlayer insulating film 48 which insulates the first trench gate 20 from the emitter electrode 46 is provided between the emitter electrode 46 and the first trench gate 20 (the first stripe portions 20a and the first annular portion 20b). An n-type buffer layer 60, a p+-type collector layer 62 and a collector electrode 64 are successively formed at a rear surface side of the substrate 40.

Figure 4:
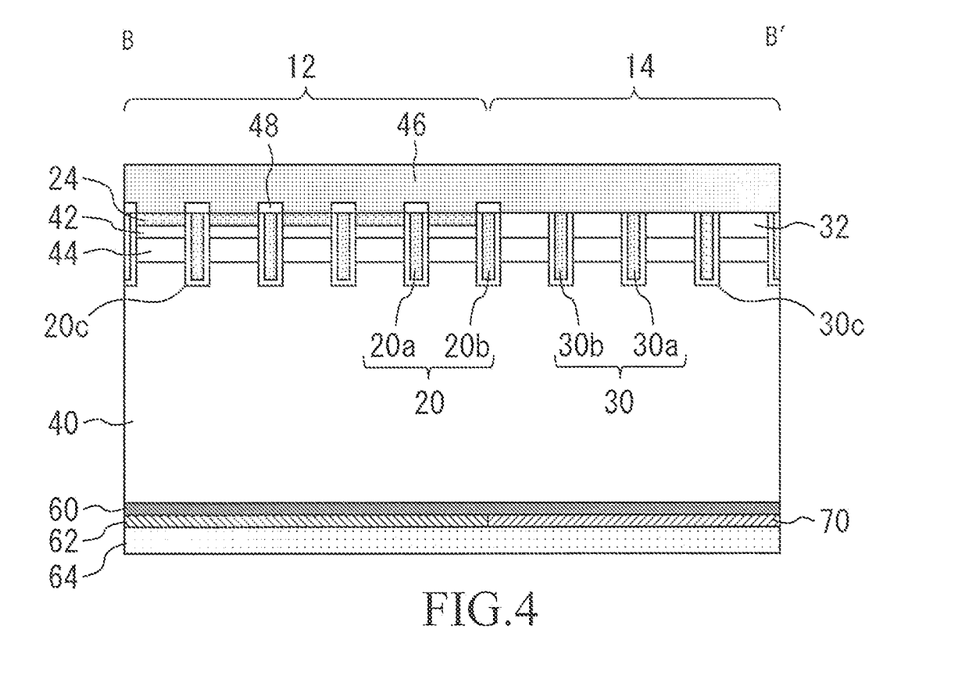
FIG. 4 is a sectional view taken along line B-B' in FIG. 2.

The diode 14 will subsequently be described. The second trench gate 30 (the second stripe portions 30a and the second annular portion 30b) and the anode layer 32 are formed at the front surface side of the substrate 40. The second trench gate 30 is bounded on the emitter electrode 46 and has an emitter potential. An n+-type cathode layer 70 is formed at the rear surface side of the substrate 40. FIG. 4 is a sectional view taken along line B-B' in FIG. 2. The IGBT 12 has the p+-type diffusion layer 24 at the front surface side of the substrate 40.

When the IGBT 12 operates, an n-channel MOSFET constituted by the carrier storage layer 44, base layer 42, emitter layer 16, gate oxide film 20c and first trench gate 20 shown in FIG. 3 is turned on. Electrons are caused to flow from the emitter electrode 46 into the substrate 40 and flow into the collector electrode 64 mainly through the collector layer 62. Positive holes then flow from the collector layer 62 into the substrate 40 through the buffer layer 60, thereby causing conductivity modulation. The current flows to the emitter layer 16 via the collector layer 62, the substrate 40, the carrier storage layer 44 and the base layer 42. When the IGBT 12 is turned off, excess carriers in the IGBT 12 are discharged from the base layer 42 to the diffusion layer 24 and from the anode layer 32 to the emitter electrode 46.

At the time of reflux operation, a reflux current flows through each diode 14 functioning as a freewheel diode. More specifically, a reflux current flows through a path from the anode layer 32 to the cathode layer 70 via the carrier storage layer 44 and the substrate 40. This reflux current starts flowing when the potential on the emitter electrode 46 becomes higher than that on the collector electrode 64. The operation before turning on, i.e., the start of flowing of the reflux current, varies depending on the gate potential. Basically, however, positive holes are injected from the anode layer 32 into the substrate 40 and electrons are injected from the cathode layer 70 into the substrate 40, thereby causing conductivity modulation so that the diode 14 is on.

An operation to turn off the diode 14 is started by reducing the potential on the emitter electrode 46 relative to that on the collector electrode 64. During this turning-off operation, the current is reduced while a pn junction of a p-layer formed of the base layer 42 and the diffusion layer 24 or the anode layer 32 and an n-layer formed of the carrier storage layer 44 is forward biased. Thereafter, the polarity is reversed; the current is increased; the forward biasing of this pn junction ceases; the increase in the current is stopped; and excess carriers in the substrate 40 are gradually discharged (recovery operation).

In the semiconductor device 10 according to the first embodiment of the present invention, the second trench gate 30 is insulated from the first trench gate 20; and therefore, the gate capacitance can be reduced in comparison with the case where the second trench gate is connected to the first trench gate. The gate drive circuit can thus be simplified.

However, there is no trench gate between the first trench gate 20 and the second trench gate 30 since the first trench gate 20 and the second trench gate 30 are insulated from each other by being spaced apart from each other. In the place where there is no trench gate, the depletion layer cannot extend smoothly from the front surface side toward the rear surface side of the substrate 40 at the time of application of the voltage $V_{CE}$, and there is a possibility of failure to secure the desired withstand voltage. The place where there is no trench gate is, referring to FIG. 2, the portion indicated with the distance W1 between the first annular portion 20b and the second annular portion 30b.

In the first embodiment of the present invention, the distance W1 between the first annular portion 20b and the second annular portion 30b is equal to or smaller than the larger one of the inter-stripe distance $D_I$ between the plurality of first stripe portions 20a and the inter-stripe distance $D_D$ between the plurality of second stripe portions 30a. Needless to say, each of the distances $D_I$ and $D_D$ is set to such a small value that the desired withstand voltage can be secured. Therefore, limitation of the extension of the depletion layer in the portion where there is no trench gate and electric field concentration due to the limitation of the extension can be avoided by setting the distance W1 equal to or smaller than the larger one of the distances $D_I$ and $D_D$, thus securing a sufficiently high withstand voltage.

As illustrated in FIG. 2, the ends of the first stripe portions 20a are bounded on the first annular portion 20b, and the ends of the second stripe portions 30a are bounded on the second annular portion 30b. Therefore, a problem of electric field concentration on the end portions of the first stripe portions 20a and the second stripe portions 30a causing degradation of the gate oxide films 20c and 30c for example can be avoided. In a case where the end portions bounded on the trench gates are covered with the diffusion layer for the purpose of relaxing electric field concentration on the ends of the trench gates, the recovery loss of the diode is increased. However, the above-described arrangement enables avoiding an increase in recovery loss.

The semiconductor device 100 according to the first embodiment of the present invention can be variously modified within such a scope that its essential feature is not lost. For example, the distance W1 between the first annular portion 20b and the second annular portion 30b, the inter-stripe distance $D_I$ between the plurality of first stripe portions 20a and the inter-stripe distance $D_D$ between the plurality of second stripe portions 30a may be set equal to each other. The spacing between the trench gates is thereby made constant through the entire semiconductor device 10. The stability of the withstand voltage can thereby be improved. The description has been made by assuming that the depth of the first trench gate 20 and the depth of the second trench gate 30 are equal to each other.

Setting the inter-stripe distance $D_I$ shown in FIG. 2 to a small value is preferable because the channel density of the MOSFET provided in the IGBT 12 can thereby be increased. On the other hand, the inter-stripe distance $D_D$ shown in FIG. 2 may be set to a value small enough to secure the desired withstand voltage, and it is not required that the inter-stripe distance $D_D$ be as small as $D_I$. Accordingly, it is preferable that the inter-stripe distance $D_I$ be smaller than the inter-stripe distance $D_D$, and that the distance W1 be equal to or smaller than the inter-stripe distance $D_D$. For example, if the depth of the trench gates in the IGBT having a withstand voltage of about 600 to 1700 V is 3 to 8 μm, a sufficiently high withstand voltage can be secured by setting the inter-stripe distance $D_I$ to 2 to 10 μm. In such a case, the inter-stripe distance $D_D$ may be set larger than 2 to 10 μm. However, the withstand voltage is reduced by this setting. It is, therefore, preferable to set the inter-stripe distance $D_D$ to 2 to 10 μm.

Figure 5:
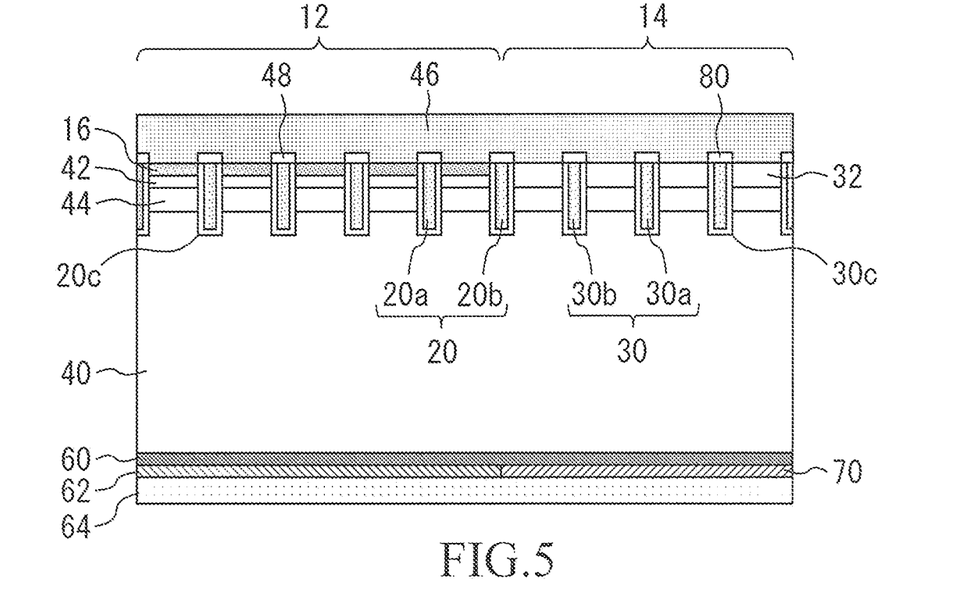
FIG. 5 is a sectional view of a semiconductor device.

In the first embodiment of the present invention, the second trench gate 30 is electrically connected to the emitter electrode 46. However, the second trench gate may alternatively be floating. FIG. 5 is a sectional view of a semiconductor device in which the second trench gate 30 is floating. An interlayer insulating film 80 is provided between the second trench gate 30 and the emitter electrode 46 to float the second trench gate 30. The potential on the second trench gate 30 is determined by the strength of capacitive coupling to the emitter electrode 46 through the interlayer insulating film 80. Also in the case where the second trench gate is floating, a sufficiently high withstand voltage can be secured by setting the distance W1 as described above. Also, the collector-emitter capacitance is reduced in correspondence with the addition of the interlayer insulating film 80. The recovery current in a low current range can thereby be reduced.

Figure 6:
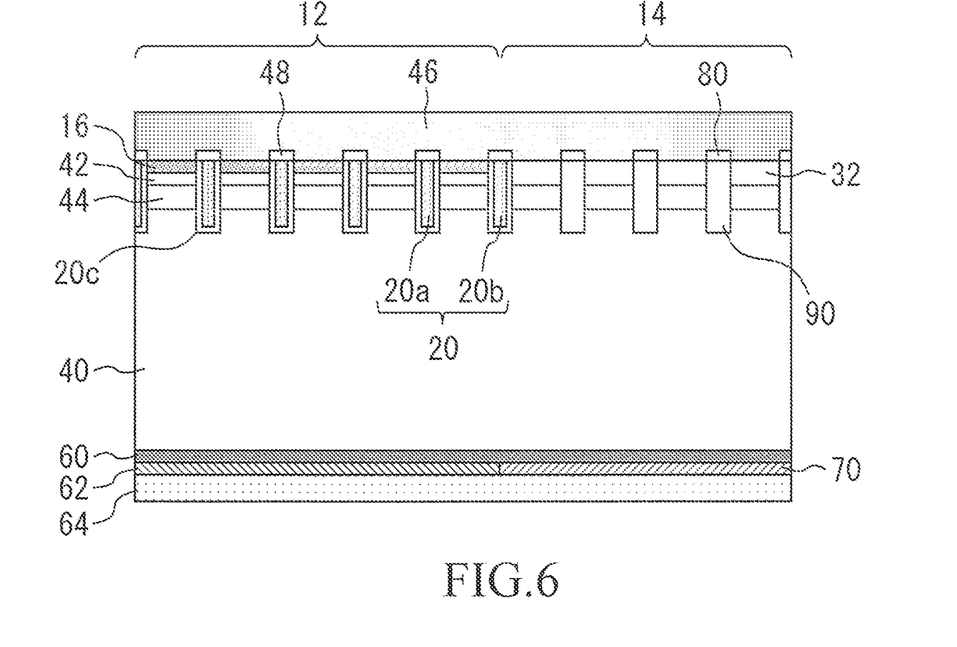
FIG. 6 is a sectional view of a semiconductor device.

The second trench gate may alternatively be formed of a buried oxide film. FIG. 6 is a sectional view of a semiconductor device in which the second trench gate is formed of a buried oxide film 90. When the second trench gate is formed of buried oxide film 90, the influence of the second trench gate on the collector-emitter capacitance is reduced to substantially zero, thus enabling the recovery current in a low current range to be reduced.

Also in the case where the second trench gate is floating or in the case where the second trench gate is formed of a buried oxide film, the gate capacitance can be reduced since the second trench gate is not connected to the gate.

These modifications can also be applied as desired to semiconductor devices according to embodiments described below. Each of the semiconductor devices according to the embodiments described below has a number of commonalities with the first embodiment and will therefore be described mainly with respect to points of difference from the first embodiment.

Second Embodiment

Figure 7:
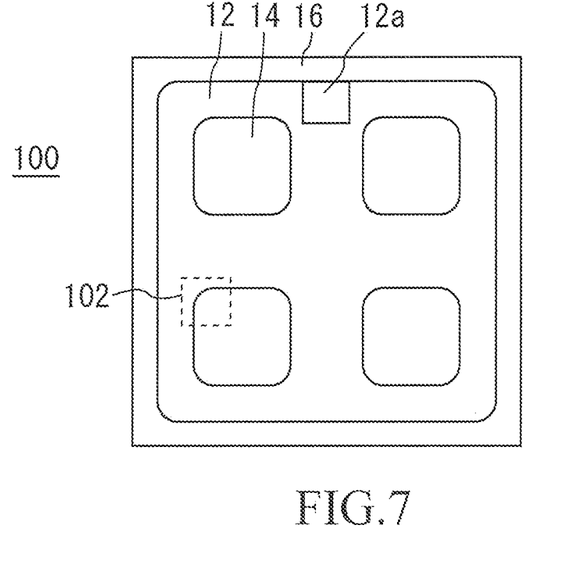
FIG. 7 is a plan view of a semiconductor device according to a second embodiment.
Figure 8:
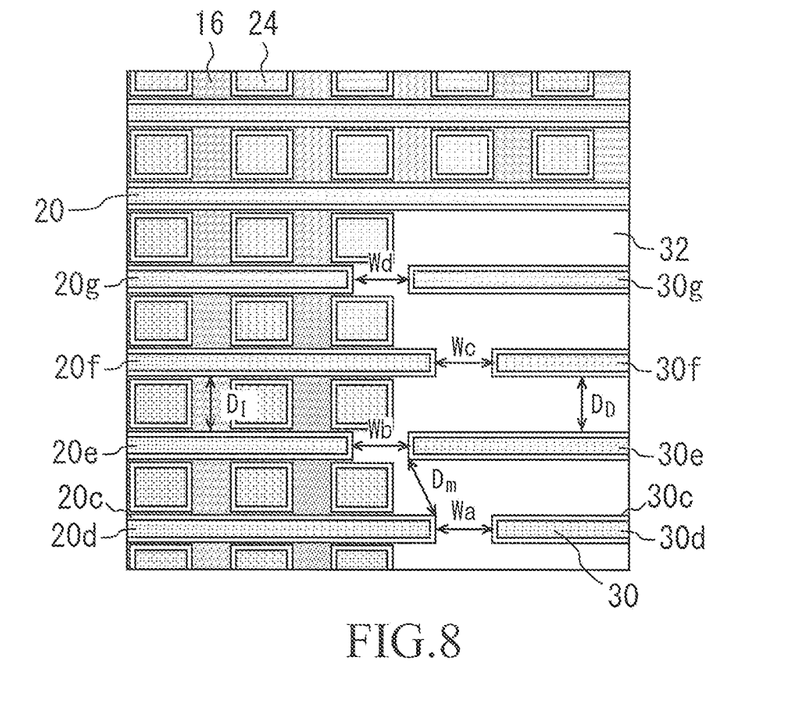
FIG. 8 is an enlarged view of a portion indicated by a broken line in FIG. 7.

FIG. 7 is a plan view of a semiconductor device according to a second embodiment of the present invention. FIG. 8 is an enlarged view of a portion 102 indicated by a broken line in FIG. 7. A first trench gate 20 has first stripe portions 20d, 20e, 20f, and 20g provided in parallel with each other. A second trench gate 30 has second stripe portions 30d, 30e, 30f, and 30g provided in parallel with each other. The second trench gate 30 is insulated from the first trench gate 20 by being spaced apart from the first trench gate 20. The second trench gate 30 is connected to an emitter electrode.

The second trench gate 30 is disposed in the direction of extension of the first trench gate 20 (the first stripe portions 20d, 20e, 20f, and 20g), with gaps provided therebetween. More specifically, the second stripe portion 30d is disposed in the direction of extension of the first stripe portion 20d, with a gap Wa provided therebetween. The second stripe portions 30e, 30f, and 30g are respectively disposed in the directions of extension of the first stripe portions 20e, 20f, and 20g, with gaps Wb, Wc, and Wd respectively provided therebetween. The gaps Wa, Wb, Wc, and Wd are staggered, as viewed in plan. That is, these gaps are zigzagged: the gap Wa being on the right-hand side with respect to the viewing direction of FIG. 8, the gap Wb being on the left-hand side, the gap Wc being on the right-hand side, and the gap Wd being on the left-hand side.

If the plurality of gaps are arranged in a row as viewed in plan, regions where the extension of the depletion layer is limited and the electric field intensity is high gather in one place; and therefore, a reduction in withstand voltage occurs easily. In the second embodiment of the present invention, however, the gaps Wa, Wb, Wc, and Wd between the first stripe portions 20d, 20e, 20f, and 20g and the second stripe portions 30d, 30e, 30f, and 30g are provided in staggered form as viewed in plan, so that the withstand voltage can be increased by increasing the intervals between the gaps.

The inter-stripe distance $D_I$ between the (six) first stripe portions in FIG. 8 is set to such a small value that the desired withstand voltage can be maintained. The inter-stripe distance $D_D$ between the second stripe portions is also set to such a small value that the desired withstand voltage can be maintained. It is preferable that the length of the gaps Wa, Wb, Wc, and Wd be set equal to or smaller than the larger one of the inter-stripe distance $D_I$ between the plurality of first stripe portions and the inter-stripe distance $D_D$ between the plurality of second stripe portions. A sufficiently high withstand voltage can be secured in this way.

From the viewpoint of increasing the withstand voltage, the shortest distance between the gaps should be increased. The shortest distance between the gaps is indicated by Dm in FIG. 8. The shortest distance between the gaps Wa, Wb, Wc, and Wd can be increased by forming the gaps in staggered form. If the shortest distance Dm between the gaps is set equal to or larger than the larger one of the inter-stripe distance $D_I$ between the plurality of first stripe portions and the inter-stripe distance $D_D$ between the plurality of second stripe portions, a sufficiently high withstand voltage can be secured. This shortest distance Dm is, for example, equal to or larger than 2 μm.

Third Embodiment

Figure 9:
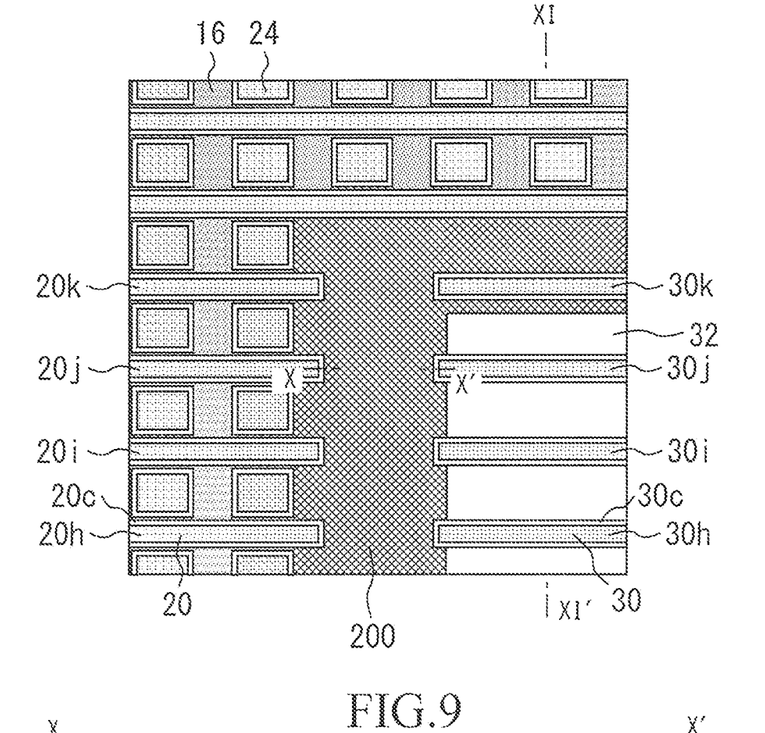
FIG. 9 is a plan view of a portion at the boundary between an IGBT and a diode in a semiconductor device according to a third embodiment.

FIG. 9 is a plan view of a portion at the boundary between an IGBT and a diode in a semiconductor device according to a third embodiment of the present invention. A feature of the semiconductor device according to the third embodiment of the present invention resides in the structure at the boundary between the IGBT and the diode. A second trench gate 30 is insulated from a first trench gate 20 by being spaced apart from the first trench gate 20. The second trench gate 30 is connected to an emitter electrode. Second stripe portions 30h, 30i, 30j, and 30k exist in the directions of extension of first stripe portions 20h, 20i, 20j, and 20k, respectively.

A p-well layer 200 is formed at the boundary between the IGBT 12 and the diode 14. The p-well layer 200 covers an end portion of the first trench gate 20 and an end portion of the second trench gate 30. The p-well layer 200 also covers a region between the end portion of the first trench gate 20 and the end portion of the second trench gate 30.

Figure 10:
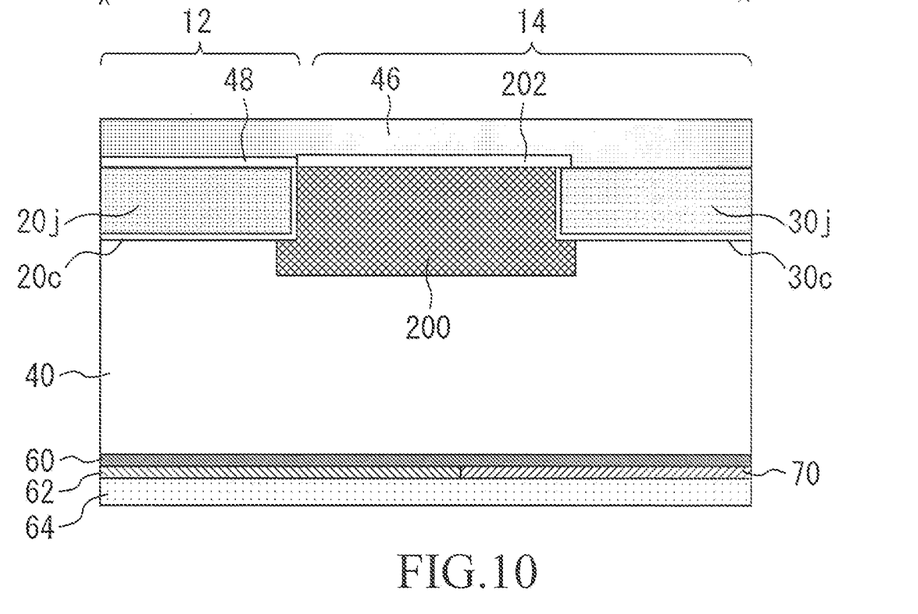
FIG. 10 is a sectional view of the semiconductor device taken along broken line X-X' in FIG. 9.

FIG. 10 is a sectional view of the semiconductor device taken along broken line X-X' in FIG. 9. The p-well layer 200 is formed deeper than the first trench gate 20 and the second trench gate 30. FIG. 10 discloses that the p-well layer 200 is formed to a deeper position in the substrate 40 relative to the first stripe portion 20j and relative to the second stripe portion 30j. The p-well layer 200 has its lower portion bounded on the substrate 40, which is a drift layer, and has its upper portion bounded on an interlayer insulating film 202.

Figure 11:
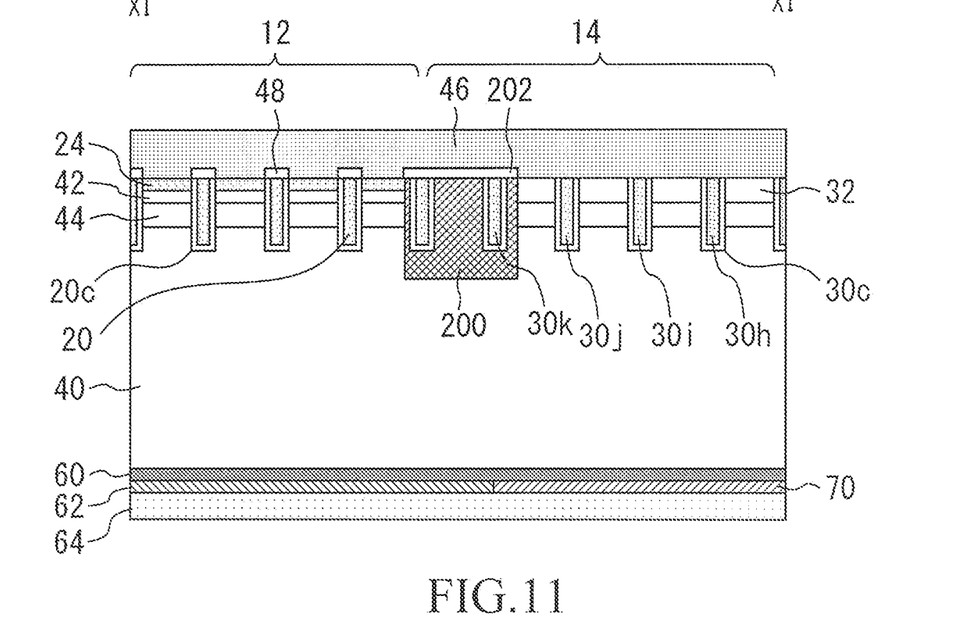
FIG. 11 is a sectional view of the semiconductor device taken along broken line XI-XI' in FIG. 9.

The impurity concentration in the p-well layer 200 is higher than that in the p-type base layer 42 of the IGBT 12. FIG. 11 is a sectional view of the semiconductor device taken along broken line XI-XI' in FIG. 9. The p-well layer 200 is connected to the emitter electrode 46 through the $p^+$-type diffusion layer 24.

Since there is no trench gate, for example, in a region between the first stripe portion 20h and the second stripe portion 30h, the depletion layer cannot extend smoothly in the lower direction of the substrate and there is a risk of the withstand voltage being reduced. Therefore, the p-well layer 200 is provided in the region where there is no trench gate. The depletion layer can extend in the lower direction of the substrate from the interface between the p-well layer 200 and the n-type substrate 40. A sufficiently high withstand voltage can therefore be secured. Also, electric field concentration on the end portion of the first trench gate 20 and the end portion of the second trench gate 30 can be avoided by covering the end portions with the p-well layer 200.

Further, the p-well layer 200 is bounded on the emitter electrode 46 through the diffusion layer 24. The current flowing through the p-well layer 200 during the reflux operation of the diode 14 can therefore be limited in comparison with a case where the p-well layer 200 is directly connected to the emitter electrode 46. As a result, the recovery current can be reduced to reduce the recovery loss. The p-well layer 200 may be connected directly to the emitter electrode 46 since the p-well layer 200 is provided primarily for the purpose of securing the desired withstand voltage.

Fourth Embodiment

Figure 12:
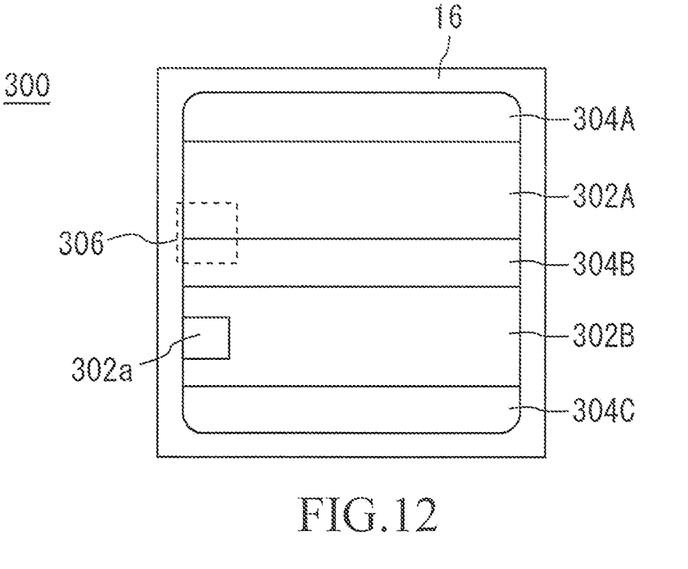
FIG. 12 is a plan view of a semiconductor device according to a fourth embodiment.

FIG. 12 is a plan view of a semiconductor device 300 according to a fourth embodiment of the present invention. The semiconductor device 300 has IGBTs 302A and 302B in stripe form and diodes 304A, 304B, and 304C in stripe form. The IGBT 302A is interposed between the diode 304A and the diode 304B. The IGBT 302B is interposed between the diode 304B and the diode 304C. Thus, the IGBTs and diodes formed so as to extend laterally are alternately provided. Gate currents in the IGBTs 302A and 302B are supplied from a gate pad 302a.

Figure 13:
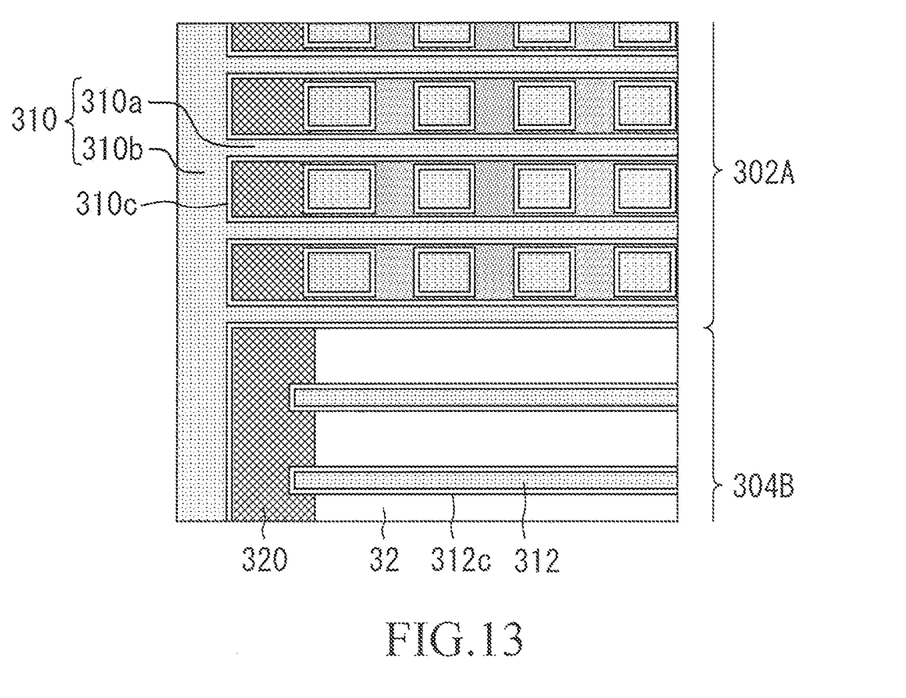
FIG. 13 is an enlarged view of a portion surrounded by broken line in FIG. 12.

FIG. 13 is an enlarged view of a portion surrounded by broken line 306 in FIG. 12. A first trench gate 310 has first stripe portions 310a and a peripheral portion 310b connected to ends of the first stripe portions 310a. The first stripe portions 310a and the peripheral portion 310b are covered with a gate oxide film 310c. A second trench gate 312 is formed of a plurality of stripes. The second trench gate 312 is covered with the gate oxide film 312c and is connected to an emitter electrode and grounded. A p-well layer 320 is formed on an end portion of the second trench gate 312 and between the end portion of the second trench gate 312 and the first trench gate 310. The functions of the p-well layer 320 are the same as those of the p-well layer 200 in the third embodiment (FIG. 9).

The important feature of the present invention resides in that a portion where there is no trench gate exists at the boundary between the first trench gate in the IGBT and the second trench gate in the diode, and that measures are taken to prevent this portion from becoming the cause of a reduction in withstand voltage. Accordingly, the present invention is useful for any semiconductor device having an IGBT and a diode adjacent to each other, and the configuration and disposition of the IGBT and the diode are not specified particularly restrictively. A combination of some of the features of the semiconductor devices according to the embodiments described above may be made and used as desired.

According to the present invention, the distance between the trench gate in the IGBT and the trench gate in the diode is reduced or a p-well layer is provided between the trench gate in the IGBT and the trench gate in the diode, thereby securing a sufficiently high withstand voltage while reducing the gate capacitance.

Obviously many modifications and variations of the present invention are possible in the light of the above teachings. It is therefore to be understood that within the scope of the appended claims the invention may be practiced otherwise than as specifically described.

What is claimed is:

1. A semiconductor device comprising:
an IGBT having a first trench gate and an emitter layer formed at a front surface side of a substrate and having a collector layer formed at a rear surface side of the substrate; and
a diode having a second trench gate and an anode layer formed at the front surface side of the substrate and having a cathode layer formed at the rear surface side of the substrate,
wherein the second trench gate is insulated from the first trench gate,
the first trench gate has a plurality of first stripe portions and a first annular portion surrounding the diode as viewed in plan,
the second trench gate has a plurality of second stripe portions and a second annular portion opposed to the first annular portion and surrounding the plurality of second stripe portions as viewed in plan,
the distance between the first annular portion and the second annular portion is constant, and
the distance between the first annular portion and the second annular portion is equal to or smaller than the larger one of the inter-stripe distance between the plurality of first stripe portions and the inter-stripe distance between the plurality of second stripe portions.

2. The semiconductor device according to claim 1, wherein the distance between the first annular portion and the second annular portion, the inter-stripe distance between the plurality of first stripe portions and the inter-stripe distance between the plurality of second stripe portions are equal to each other.

3. A semiconductor device comprising:
an IGBT having a first trench gate and an emitter layer formed at a front surface side of a substrate and having a collector layer formed at a rear surface side of the substrate; and
a diode having a second trench gate and an anode layer formed at the front surface side of the substrate and having a cathode layer formed at the rear surface side of the substrate,
wherein the second trench gate is insulated from the first trench gate,
the first trench gate has a plurality of first stripe portions,
the second trench gate has a plurality of second stripe portions,
the second trench gate is disposed in a direction of extension of the first trench gate, with gaps provided between the second trench gate and the first trench gate, and
the gaps are staggered as viewed in plan.

4. The semiconductor device according to claim 3, wherein the length of the gaps is equal to or smaller than the larger one of the inter-stripe distance between the plurality of first stripe portions and the inter-stripe distance between the plurality of second stripe portions.

5. The semiconductor device according to claim 3, wherein the gaps are provided so that the shortest distance between the gaps is equal to or smaller than the larger one of the inter-stripe distance between the plurality of first stripe portions and the inter-stripe distance between the plurality of second stripe portions.

6. A semiconductor device comprising:
an IGBT having a first trench gate and an emitter layer formed at a front surface side of a substrate having an n-type drift layer, the IGBT also having a collector layer formed at a rear surface side of the substrate; and
a diode having a second trench gate and an anode layer formed at the front surface side of the substrate and having a cathode layer formed at the rear surface side of the substrate,
the second trench gate being insulated from the first trench gate by being spaced apart from the first trench gate; and
a p-well layer covering an end portion of the second trench gate, covering a region between end portions of the first trench gate and the second trench gate, formed deeper than the first trench gate and the second trench gate and bounded on the drift layer.

7. The semiconductor device according to claim 6, wherein an impurity concentration in the p-well layer is higher than an impurity concentration in a base layer of the IGBT.

8. The semiconductor device according to claim 1, further comprising an emitter electrode connected to the emitter layer,
wherein the second trench gate is electrically connected to the emitter electrode.

9. The semiconductor device according to claim 1, wherein the second trench gate is floating.

10. The semiconductor device according to claim 1, wherein the second trench gate is formed of a buried oxide film.

* * * * *